United States Patent [19]

Affinito et al.

[11] Patent Number: 5,681,615
[45] Date of Patent: Oct. 28, 1997

[54] VACUUM FLASH EVAPORATED POLYMER COMPOSITES

[75] Inventors: John D. Affinito, Kennewick; Mark E. Gross, Pasco, both of Wash.

[73] Assignee: Battelle Memorial Institute, Richland, Wash.

[21] Appl. No.: 508,278

[22] Filed: Jul. 27, 1995

[51] Int. Cl.⁶ .................................................. C23C 14/24
[52] U.S. Cl. ...................... 427/255.6; 427/314; 427/565; 427/600
[58] Field of Search ............................. 427/255.6, 314, 427/565, 600

[56] References Cited

U.S. PATENT DOCUMENTS

| | | | |
|---|---|---|---|
| 4,842,893 | 6/1989 | Yializis et al. | 427/44 |
| 4,954,371 | 9/1990 | Yializis | 427/44 |
| 5,032,461 | 7/1991 | Shaw et al. | 427/255.6 |
| 5,260,095 | 11/1993 | Affinito | 427/124 |

*Primary Examiner*—Roy V. King
*Attorney, Agent, or Firm*—Douglas E. McKinley, Jr.

[57] ABSTRACT

A method for fabrication of polymer composite layers in a vacuum is disclosed. More specifically, the method of dissolving salts in a monomer solution, vacuum flash evaporating the solution, condensing the flash evaporated solution as a liquid film, and forming the condensed liquid film into a polymer composite layer on a substrate is disclosed.

4 Claims, No Drawings

VACUUM FLASH EVAPORATED POLYMER COMPOSITES

This invention was made with Government support under Contract DE-AC06-76RLO 1830 awarded by the U.S. Department of Energy. The Government has certain rights in the invention.

FIELD OF THE INVENTION

The present invention relates generally to a method for fabrication of polymer composite layers in a vacuum. More specifically, the invention relates to dissolving salts in a monomer solution, flash evaporating the solution, and forming the evaporated solution into a polymer composite layer on a substrate.

BACKGROUND OF THE INVENTION

Laminate structures having at least one polymer layer have been shown to be useful in a wide variety of applications including, but not limited to, electronic devices, such as circuit elements and electrochromic devices, packaging materials, and solar reflectors. Also, polymer layers which also contain ions or salts have been shown to exhibit characteristics not present in simple polymer layers. Thus, polymer layers containing ions or salts, or composite polymers, may exhibit a variety of characteristics, such as increased ion conductivity, which may render them superior to polymers which do not include ions or salts, for specific uses.

Several techniques are known in the art for the mass production of polymer and polymer composite layers under vacuum conditions. For example, polymer and polymer composite layers have been produced by methods including, but not limited to, extrusion and monomer spreading apparati such as roll coaters, gravure roll coaters, wire wound rods, doctor blades and slotted dies, wherein a liquid monomer or a liquid monomer solution containing ions or salts is deposited onto a substrate and cured.

Vacuum flash evaporation of monomer fluids has also been shown to be a useful process for creating thin polymer layers in laminate structures. However, those skilled in the art have avoided the use of the vacuum flash evaporation method for the formation of polymer composite layers. Generally, the temperature required to evaporate salts is too high to permit the inclusion of salts in the evaporation of monomers according to the flash evaporation method. For example, U.S. Pat. No. 4,954,371 incorporated herein by reference, "Flash Evaporation of Monomer Fluids" discloses a method for continuously supplying a polymerizable and/or cross linkable material at a temperature below the decomposition and polymerization temperature of the material. The material is atomized to droplets having a particle size ranging from about 1 to about 50 microns. The droplets are then vaporized, under vacuum, by contact with a heated surface above the boiling point of the material, but below the temperature which would cause pyrolysis. The method teaches that by condensing the vapor onto a substrate as a liquid, the material may then be polymerized or cross linked, allowing the formation of very thin polymer layers in a laminate structure.

The use of the vacuum flash evaporation method provides a polymer layer with certain advantages over other methods of forming polymer layers, including, but not limited to the ability to create more uniform and thinner polymer layers, a reduction of trapped gas under the polymer layer, greater density within the polymer layer and a smoother finished surface.

It is therefore of great interest to those skilled in the art to have a method for forming polymer composite layers including ions or salts and having the advantages of the vacuum flash evaporation method.

SUMMARY OF THE INVENTION

The present invention relies on the unexpected discovery that, when fully solvated, salts dissolved in monomer solutions may be evaporated along with the monomer according to the vacuum flash evaporation method and thereby used to form composite polymer layers under vacuum. More specifically, according to the present invention, a salt is first fully solvated in a monomer solution. The mixture is then used to form polymer composite layers according to the vacuum flash evaporation method. Also, a combination of solvents, photo-curing agents, adhesion promoters or slip agents may be added to the monomer/salt mixture prior to flash evaporation.

DESCRIPTION OF THE PREFERRED EMBODIMENT(S)

In a preferred embodiment of the present invention, a salt is dissolved or solvated in a polymerizable and/or cross linkable material, typically a monomer solution containing at least one monomer in a liquid state, to form a polymerizable composite material. The salt may be any ionic compound wherein the ions can be made to dissociate in the solution including but not limited to binary and complex salts. As used herein, the term complex salt is any salt having more than two elements. Other constituents may be added as desired, for example, a solvent may be added to aid in solvation of the salt within the monomer solution, an adhesion promoter to aid in the formation of the composite polymer on a substrate, or a photoinitiator to aid in the polymerization of the composite polymer. Once the salt is dissolved or solvated, the polymerizable composite material, is processed according to the vacuum flash evaporation process whereby the polymerizable composite material is continuously supplied as a substantially uniform vapor under vacuum. The method thus allows the polymerizable composite material to be deposited on a substrate under vacuum to form a composite polymer layer.

The polymerizable composite material is continuously supplied at a temperature below the decomposition and polymerization temperature of the material. The material is atomized to droplets having a particle size ranging from about 1 to about 50 microns. The droplets are then vaporized by contact with a heated surface above the boiling point of the material, but below the temperature which would cause pyrolysis. The vapor is then brought into contact with a substrate, where the material condenses as a liquid film and is then polymerized or cross linked, allowing the formation of a composite polymer layer under vacuum.

It is preferred that the salt be solvated in the monomer solution to the maximum extent possible prior to flash evaporation. The more complete the solvation, the greater the amount of the salt, or ions of the salt, will be available to be evaporated along with the monomer solution, and thereby formed into the polymer composite layer. Also, the relative concentration of salt to monomer can be varied by varying the amount of salt in the monomer solution. Beginning with no salt added to the monomer, salt may be added to any desired concentration up to saturation of the monomer solution.

EXAMPLES

An experiment was done wherein 150 mL of polyethyleneglycol diacrylate, 150 mL of polyethyleneglycol methyl ether, 15 mL of acrylic acid adhesion promoter, 30 mL of commercially available Darocure 4265 photoinitiator available from CIBA/GEIGY Inc., Hawthorn, N.Y., and 20 g of $LiCF_3SO_3$ was mixed until the $LiCF_3SO_3$ was completely solvated in the mixture. The mixture was then formed into a multilayer lamellar composite in accordance with the vacuum flash evaporation method of the present invention. The laminar composite consisted of a layer of the composite polymer material placed in between two layers of aluminum in an interdigitated capacitor structure where all layers were vacuum deposited. The multilayer lamellar composite was then tested with a standard voltmeter and exhibited a conductance consistent with electrolyte material, indicating the inclusion of the ions of the $LiCF_3SO_3$ salt in the polymer.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method for continuously supplying a uniform vapor of a polymerizable composite material in vacuum, said method comprising:

a) dissolving a salt in a monomer to form said polymerizable composite material, b) supplying a continuous liquid flow of said composite material into a vacuum environment at a temperature below both the decomposition temperature and the polymerization temperature of the composite material, c) continuously atomizing the liquid flow into a continuous flow of liquid droplets; and d) continuously vaporizing said liquid droplets by causing said droplets to contact a heated surface which is maintained at a temperature at or above the boiling point for said composite material, but below the temperature at which said droplets would undergo pyrolysis before vaporizing.

2. A method for depositing onto a substrate in a vacuum environment a layer of polymerizable composite material, said material being characterized by the fact that it is chemically unstable at or below its boiling point, said method comprising:

a) dissolving a salt in a monomer to form said polymerizable composite material, b) vaporizing said composite material into a vacuum environment by continuously placing droplets of said composite material into contact with a heated surface which is maintained at a temperature at or above the boiling point for said composite material, but below the temperature at which said droplets would undergo pyrolysis before vaporizing, c) maintaining at least a portion of said substrate at a temperature which is below the boiling point of said composite material and in a region which is at a lower pressure than said vaporized composite material, to provide a positive flow of vaporized composite material toward said substrate; and d) directing the flow of said vaporized composite material onto said substrate.

3. A method for depositing a layer of a polymerizable composite material on a substrate in a vacuum environment comprising:

a) dissolving a salt in a monomer to form said polymerizable composite material, b) supplying a continuous liquid flow of said composite material into a vacuum environment at a temperature below both the decomposition temperature and the polymerization temperature of the composite material, c) continuously atomizing the liquid flow into a continuous flow of liquid droplets;

d) continuously vaporizing said liquid droplets by causing said droplets to contact a heated surface which is maintained at a temperature at or above the boiling point for said composite material, but below the temperature at which said droplets would undergo pyrolysis before vaporizing, e) maintaining at least a portion of said substrate at a temperature which is below the boiling point of said composite material and in a region which is at a lower pressure than said vaporized composite material, to provide a positive flow of vaporized composite material toward said substrate; and f) directing the flow of said vaporized composite material onto said substrate.

4. A method for continuously supplying a uniform vapor of a polymerizable composite material in a vacuum environment, said method comprising:

a) dissolving a salt in a monomer to form said polymerizable composite material, b) providing a liquid supply of said composite material in a vacuum environment at a temperature below both the decomposition temperature and the polymerization temperature of the composite material, to an end surface at a tip of an ultrasonic vibrating device, c) ultrasonically vibrating said device so that the composite material supplied to the end surface coats the end surface and is dispersed in droplets from the periphery of the end surface; and d) continuously vaporizing said liquid droplets by causing said droplets to contact a heated surface which is maintained at a temperature at or above the boiling point for said composite material, but below the temperature at which said droplets would undergo pyrolysis before vaporizing.

* * * * *